United States Patent [19]

Lynch

[11] Patent Number: 4,794,091
[45] Date of Patent: Dec. 27, 1988

[54] METHOD OF MAKING HIGH-PERFORMANCE DRAM ARRAYS INCLUDING TRENCH CAPACITORS

[75] Inventor: William T. Lynch, Summit, N.J.

[73] Assignee: American Telephone and Telegraph Company, AT&T Bell Laboratories, Murray Hill, N.J.

[21] Appl. No.: 121,556

[22] Filed: Nov. 17, 1987

Related U.S. Application Data

[62] Division of Ser. No. 758,885, Jul. 25, 1985, abandoned.

[51] Int. Cl.$^4$ .................................. H01L 21/302
[52] U.S. Cl. .................................. 437/48; 437/47; 437/52; 437/60; 437/79; 437/160; 437/203
[58] Field of Search ............ 437/47, 48, 60, 52, 437/79, 160, 203; 357/236

[56] References Cited

U.S. PATENT DOCUMENTS

| 3,387,286 | 6/1968 | Dennard | 357/23.6 |
|---|---|---|---|
| 4,109,270 | 8/1978 | von Basse et al. | 437/203 |
| 4,194,283 | 3/1980 | Hoffmann | 357/23.6 |
| 4,353,086 | 10/1982 | Jaccodine et al. | 437/160 |
| 4,569,701 | 2/1986 | Oh | 437/160 |
| 4,649,625 | 3/1987 | Lu | 437/203 |
| 4,672,410 | 6/1987 | Miwia et al. | 357/23.6 |
| 4,673,962 | 6/1987 | Chatterjee et al. | 357/23.6 |
| 4,683,486 | 7/1987 | Chatterjee | 357/23.6 |
| 4,686,552 | 8/1987 | Teng et al. | 357/23.6 |
| 4,688,063 | 8/1987 | Lu et al. | 357/23.6 |

FOREIGN PATENT DOCUMENTS 60-128658 7/1985 Japan.
60-74667 4/1986 Japan.

OTHER PUBLICATIONS

Shah et al. "A 4-mbit Dram With Trench Transistor Cell" IEEE J. of Solid-State Circuits, vol. SC-211, No. 5, Oct. 86, pp. 618-626.
IEEE Transactions on Electron Devices, vol. ED-25, No. 1, Jan. 1978, "The Hi-C Ram Cell Concept" by A. F. Tasch et al, pp. 33-41.
IEEE Electron Device Letters, vol. EDL-4, No. 11, Nov. 1983, "Depletion Trench Capacitor Technology for Megabit Level MOS DRAM" by T. Morie et al, pp. 411-414.
1984 Symposium on VLSI Technology, San Diego, CA, Sep., 1984, A Vertical Capacitor Cell for VLSI DRAM'S, Tohru Furuyama and Jeffrey Frey.
Schuster, IBM Tech. Discl. Bulletin, vol. 22, No. 8B, Jan., 1980, pp. 3852-3855.

Primary Examiner—Brian E. Hearn
Assistant Examiner—Tom Thomas
Attorney, Agent, or Firm—Lucian C. Canepa; Scott W. McLellan

[57] ABSTRACT

Parallel elongated trenches in a silicon substrate are utilized to form multiple distinct memory cell capacitors on each continuous wall of each trench. Chanstops are formed between adjacent capacitors to achieve electrical isolation. A separate word line overlies each trench wall and is connected via respective MOS transistors to the spaced-apart capacitors formed on the wall. A reliable high-density memory characterized by excellent performance is thereby realized.

1 Claim, 10 Drawing Sheets

MEMORY-CELL REGION

BETWEEN-CELL REGION

MEMORY-CELL REGION

BETWEEN-CELL REGION

MEMORY—CELL REGION

BETWEEN—CELL REGION

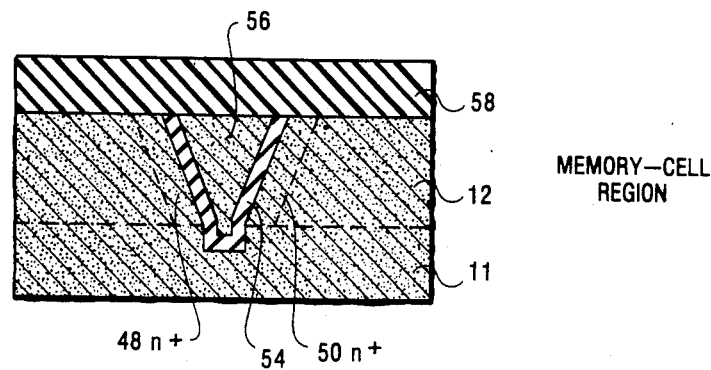
FIG. 19 — MEMORY—CELL REGION
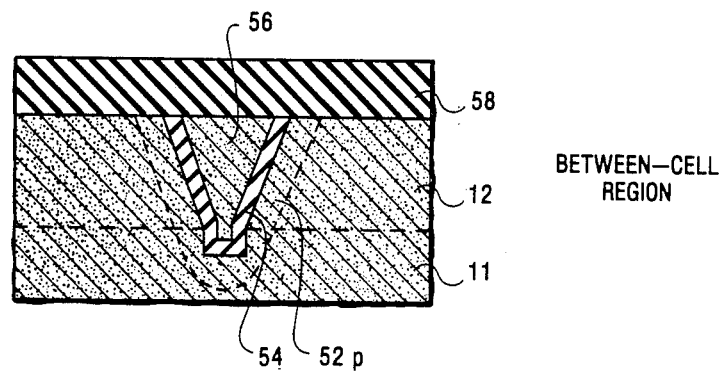
FIG. 20 — BETWEEN—CELL REGION
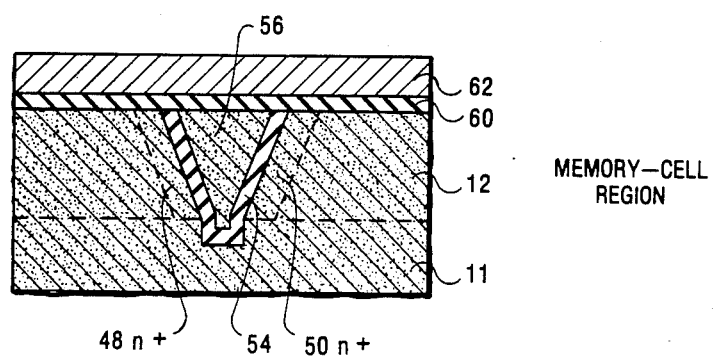
FIG. 21 — MEMORY—CELL REGION

BETWEEN—CELL REGION

MEMORY—CELL REGION

BETWEEN—CELL REGION

METHOD OF MAKING HIGH-PERFORMANCE DRAM ARRAYS INCLUDING TRENCH CAPACITORS

This application is a divisional of application Ser. No. 758,885, filed July 25, 1985, now abandoned.

BACKGROUND OF THE INVENTION

This invention relates to dynamic random-access-memory (DRAM) arrays made in very-large-scale-integrated (VLSI) form and, more particularly, to a high-performance VSLI DRAM chip that includes trench capacitors.

As the trend toward further miniaturization of VLSI DRAM arrays continues, considerable efforts are being directed at trying to reduce the area of the basic memory cell from which the arrays are formed. One such common cell configuration known in the art comprises a single transistor and an associated capacitor, as described, for example, in U.S. Pat. No. 3,387,286.

In practice, the surface area of conventional planar-type capacitors included in VLSI DRAM memory cells has been reduced to the point where the charge capacity of such a small-area capacitor barely exceeds the charge levels produced by noise mechanisms such as those attributable to alpha particles. Even planar capacitors of the so-called Hi-C type do not satisfy some of the current design requirements specified for increasingly small-area VLSI DRAM memory cells. (See, for example, "The Hi-C RAM Cell Concept" by A. F. Tasch et al, IFEE Transactions on Electron Devices, Vol. ED-25, No. 1, January 1978, pages 33–41, for a description of a planar Hi-C memory capacitor.)

In order to realize specified values of capacitance in relatively small-surface-area capacitors, proposals have been recently made for fabricating each cell capacitor as a vertical structure that extends into the substrate of the semiconductor chip in which the VLSI DRAM memory is formed. This so-called trench capacitor design has a major portion of its plates extending into rather than along the surface of the chip. The amount of surface area required per capacitor is only the area of the trench at the surface of the chip. (An article entitled "Depletion Trench Capacitor Technology for Megabit Level MOS dRAM" by T. Morie et al, *IEEE Electron Device Letters*, Vol. EDL-4, No. 11, November 1983, pages 411–414, contains a description of a memory capacitor of the trench type.)

Many motivations exist for desiring to make VLSI DRAM tranch capacitors in Hi-C form analogous to the Hi-C capacitors used in planar structures. The capacitance-to-chip surface-area-ratio of a Hi-C trench capacitor is high. Additionally, the relatively high capacitance values that are thereby achievable in a VLSI chip minimize the chances of alpha-particle-induced errors occurring therein. Further, the series resistance of such a Hi-C structure is typically orders of magnitude less than that of a capacitor in which one plate is formed only by inversion effects. All of these and other advantages of a memory cell that includes a Hi-C trench capacitor make it possible to achieve high-density cell packing in a memory array characterized, for example, by relatively low parasitic capacitances, relatively low sheet resistance and relatively high cell capacitance per unit area.

Considerable efforts have been directed by workers in the art aimed at trying further to improve the design of memory trench capacitors. In particular, these efforts have concentrated on attempting to realize even greater density and improved electrical characteristics of the constituent trench capacitors of the memory cells. It was recognized that these efforts, if successful, had the potential for making a significant contribution to the realization of improved very-high-bit-capacity VLSI DRAM arrays.

SUMMARY OF THE INVENTION

Hence, an object of the present invention is an improved VLSI DRAM array. More specifically, an object of this invention is an improved VLSI DRAM structure of the type whose memory cells include Hi-C capacitors formed in trenches. Another object of the invention is a relatively simple fabrication sequence for reliably achieving such a structure.

Briefly, these and other objects of the present invention are realized in a specific illustrative VLSI DRAM embodiment thereof that includes parallel elongated trenches formed in a silicon substrate. Multiple distinct Hi-C capacitors are fabricated on each continuous wall of each trench. Capacitors fabricated on one wall of a trench are electrically isolated from the capacitors defined in the facing wall of the trench. Additionally, chanstops are formed on each wall to achieve electrical isolation between capacitors along the wall. A separate word line overlies each trench wall and is connected via respective transistors to the spaced-apart capacitors formed on the wall.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which:

FIGS. 1 through 26 are schematic representations at successive stages of an exemplary fabrication sequence utilized to make a portion of a specific illustrative VLSI DRAM memory array that embodies the principles of the present invention.

DETAILED DESCRIPTION

By way of example, the particular VLSI DRAM array to be described below includes memory cells each comprising a single n-channel metal-oxide-semiconductor (NMOS) transistor and an associated Hi-C trench capacitor. For one-micrometer ($\mu$m) design rules, with approximately 0.25-$\mu$m alignment tolerances, each cell measures only about 4.5 $\mu$m in the Y-direction by 3.25 $\mu$m in the X-direction on the surface of a silicon chip whose total memory array surface area approximates 0.6 square centimeters. A chip area of this size is thus capable of having defined therein a 4-megabit memory array composed of such small-area cells.

Although emphasis in the description below will be primarily on making Hi-C trench capacitors in a p-doped region for connection to associated NMOS transistors, it is to be understood that the described fabrication procedure is also applicable to making Hi-C trench capacitors in an n-doped region for connection to associated PMOS transistors. Additionally, if desired, memory arrays of the general type specified below may also therefore be fabricated in complementary-MOS (CMOS) technology.

Figure 1:
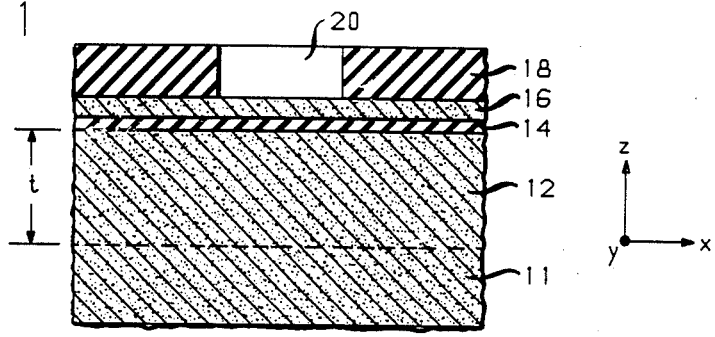

FIG. 1 is a cross-sectional representation of a portion of a VLSI DRAM silicon chip at an early shape of its fabrication. By way of a specific illustrative example, the depicted portion comprises a p+ region 11 having a p-type epitaxial layer 12 formed thereon. In a practical embodiment, the thickness t of the layer 12 is, for example, selected to be in the range of 4-to-15 micrometers (μm). As will be evident later below, the particular thickness selected depends on the amount of storage capacitance specified for each memory cell in the DRAM chip.

The next step in the fabrication sequence is to mask all but multiple spaced-apart elongated portions of the top surface of the layer 12 (FIG. 1). An advantageous trilayer structure for accomplishing this is shown in FIG. 1. The depicted structure comprises, for example, a thermally grown layer 14 of silicon dioxide about 200-to-500 Angstrom units (Å) thick, a layer 16 of polysilicon about 3000-to-4000 Å thick formed by chemical vapor deposition (CVD) and a CVD-formed layer 18 of silicon dioxide approximately 3000-to-10,000 Å thick.

Formation of a mask for cutting trenches in the layer 12 of FIG. 1 involves initially forming spaced-apart Y-direction slots in the layer 18. This is done by conventional lithographic and etching techniques. One such slot 20 is shown in FIG. 1.

Figure 2:
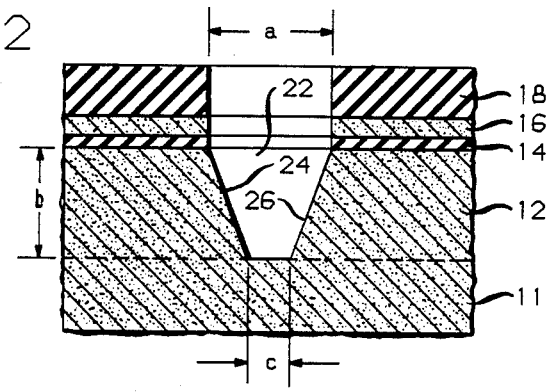

Subsequently, slots corresponding to the slot 20 in the layer 18 are respectively opened in the layers 16 and 14. This is done, for example, by standard reactive ion (or sputter) etching (RIE) procedures. Then trenches, such as the trench 22 shown in FIG. 2, are formed in the device structure in, for instance, an RIE step utilizing a plasma derived from a reactive chlorine species. By way of example, the dimensions a, b and c of the trench 22, and of each of the other identically formed trenches in one specific illustrative structure, are approximately 1.5 μm, 6 μm and 0.5 μm. As indicated in FIG. 2, the trench 22 includes facing sidewalls 24 and 26.

The bottom of the trench 22 is shown in FIG. 2 as being located approximately at the interface between the p+ region 11 and the p-type layer 12. Accordingly, for the particular above-assumed case in which the depth b of the trench 22 is 6 μm, the thickness of the layer 12 is also approximately 6 μm. During subsequent high-temperature processing steps, the upper boundary of the p+ region 11 typically moves upward from the position indicated in FIG. 2. Thus, in the final device structure the bottom of the particular trench 22 shown in FIG. 2 extends in practice into the p+-p transition zone defined by the region 11 and the layer 12.

Figure 3:
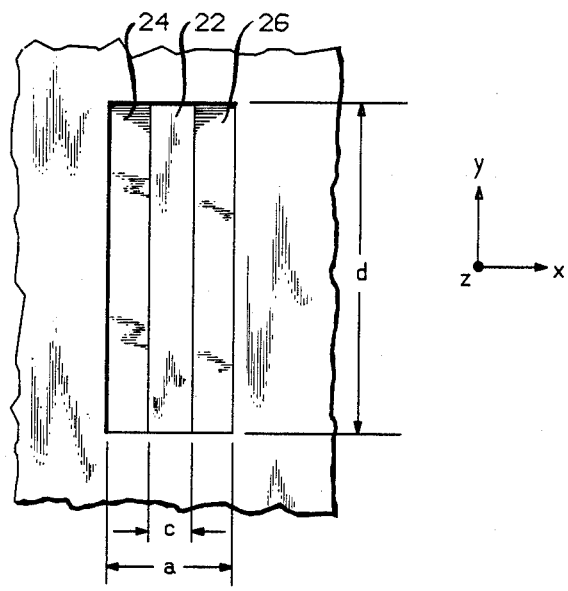

A top view of the trench 22 included in a typical memory array is shown in FIG. 3. Illustratively, the Y-direction length d of the trench is in the range of 0.1-to-0.5 centimeters (cm). The particular trench 22 specified herein is, for example, 0.46 cm long. It is assumed, for example, that the trenches in the Y-direction are divided into two series sections in order to accommodate decoder circuitry in a central region of the memory array. Shorter trench segments may be used if the word line in the Y-direction (see below) is periodically strapped to a parallel upper-level metal line in order to reduce word-line resistance.

In accordance with the principles of the present invention, multiple spaced-apart capacitors are formed on each of the facing flat walls 24 and 26 of the trench 22. In a specific illustrative 4-megabit memory array in which 2048 identical such trenches (1024 on each half of the array) are included in the device structure, 1024 capacitors are fabricated on each of the walls 24 and 26. The capacitors formed on each wall are electrically isolated from each other in the Y-direction. Additionally, the capacitors formed on one wall of a trench are electrically isolated from the capacitors formed on the facing wall of the trench. In turn, the 2048 capacitors formed in each trench are respectively included in 2048 memory cells in the herein-considered array, in a manner to be described in detail later below. As will be specified below, an elongated Y-direction word line of the array overlies each wall (such as the wall 24) and another elongated Y-direction word line overlies each facing wall (such as the wall 26). Further, 4096 X-direction bit lines are subsequently formed perpendicular to the parallel array of trenches. Each bit line is connected to 1024 MCS transistors respectively associated with the individual capacitors formed on the adjacent walls of the alternate trenches. [It is assumed, for example, that the bit lines in the X-direction are divided into two series sections in order to accommodate detector circuitry in the center. In this specific illustrative memory array, there are, therefore, four quadrants of 512 trenches (1024 word lines) by 1024 bit lines.]

To avoid undesirable inversion effects in the final device described herein, it is important that the concentration of p-type dopant in the layer 12 (FIG. 2) be above a specified minimum value (for example, above about $5 \times 10^{16}$ dopant atoms per cubic centimeter). Such a concentration can be initially established in the layer 12, can be established later in the fabrication sequence (as will be specified later below) or, optionally, can be established in the device structure at the point in the fabrication sequence represented by FIG. 2. Portions of the trench walls so doped will serve as chanstop regions between memory cells in the final device structure.

Thus, if desired, the dopant concentration of the unmasked or trench portions of the p-type layer 12 shown in FIG. 2 can be increased to or above the aforementioned minimum value by, for example, implanting boron ions into the facing walls of the trench 22. For steeply inclined walls, wobbling of the implantation source relative to the device structure may be necessary or advantageous to achieve the desired dopant enhancement in a substantially uniformly distributed manner.

Figure 4:
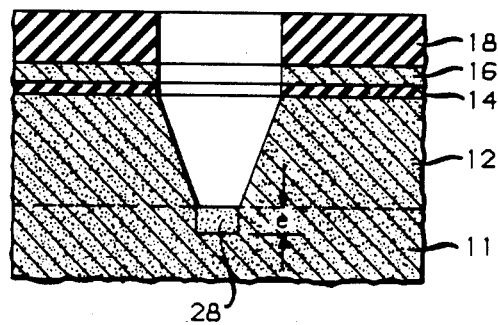

Next, in accordance with the principles of the present invention, a relatively thick insulating region is formed along the entire bottom extent of each trench. This region will serve effectively, in subsequent processing, to electrically isolate the capacitors formed on each trench wall from the capacitors formed on the respective facing wall. Such an insulating region 28 made of silicon dioxide is schematically depicted in FIG. 4. Illustratively, the thickness e of the region 28 is approximately 2000-to-3000 Å.

One advantageous way of forming the insulating region 28 of FIG. 4 is based on the recognition that the p+ region 11 can be selectively or preferentially anodized. The result of anodization is to remove about one-half of the silicon material and to leave a porous silicon matrix in the affected p+ region. Subsequently, the porous silicon is oxidized to form the silicon dioxide region 28 depicted in FIG. 4.

More specifically, anodization is accomplished, for example, by first depositing a relatively thin layer (about 100-to-300 Å) of silicon dioxide and a relatively thick layer (about 1500-to-2500 Å) of silicon nitride over the entire surface of the trench. An anisotropic reactive ion etch then leaves the trench sidewalls protected against anodization while the bottom surface of the trench is exposed. The device structure is then immersed in an electrolyte containing, for example, 5 percent hydrofluoric acid in a 1:1 solution of acetic acid and water. The device structure is connected to the positive terminal of a dc power supply to whose negative terminal a platinum electrode is connected. By passing approximately 0.75 milliamperes per square centimeter through the electrolyte for about 12 minutes, the specified region 28 (FIG. 4) is selectively etched and rendered porous.

Oxidation of approximately 2400 Å of the porous silicon is then carried out by exposing the device structure to oxygen in a furnace at about 900 degrees Celsius for about 5 minutes or by carrying out a rapidthermal-annealing (RTA) step at approximately 1050 degrees Celsius for about 60 seconds. The resulting silicon dioxide region 28 occupies about the same volume as the silicon that was anodized and more porous. As a result, the insulating region 28 is substantially stress-free.

The silicon nitride on the trench sidewalls is then etched in, for example, hot phosphoric acid. The sidewall oxide is then etched. This partially reduces the thickness of the silicon dioxide region 28. At this point in the fabrication sequence, the device structure appears as depicted in FIG. 4.

Further details containing the aforedescribed anodization and oxidation procedure are set forth in a commonly owned application of W. T. Lynch and T. E. Seidel (Case 24-10), Ser. No. 758,797, now U.S. Pat. No. 4,643,804, filed concurrently herewith.

Figure 5:
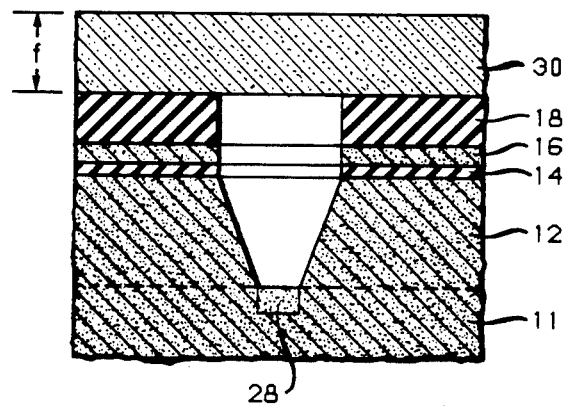

Next, in accordance with the principles of the present invention, spaced-apart n+ regions are formed along the facing trench walls of the herein-considered device structure. Illustratively, the first step in accomplishing this is to deposit a relatively thick layer 30 (FIG. 5) of phosphorus-doped silicon dioxide (so-called P-glass) in the trenches and on the entire top surface of the multi-layered structure. By way of example, the thickness f of the layer 30 is approximately 2 μm. In practice, the top surface of the layer 30 is thereby rendered substantially flat, as depicted in FIG. 5.

Figure 6:
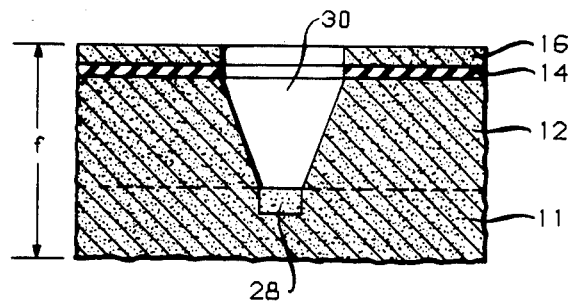

In a subsequent step that involves standard dry or wet etching, the layer 30 is uniformly etched down along with layer 18 until layer 18 is completely removed from the device structure. The polysilicon layer 16 acts as a natural etch stop. The resulting planar structure appears as shown in FIG. 6. At that point, portions of the P-glass layer 3C exist substantially only in the trenches of the structure. In subsequent processing, selected portions of the layer 30 in the trenches will serve as an n-type dopant source for establishing the aforementioned spaced-apart n+ regions in the trenches.

Figure 7:
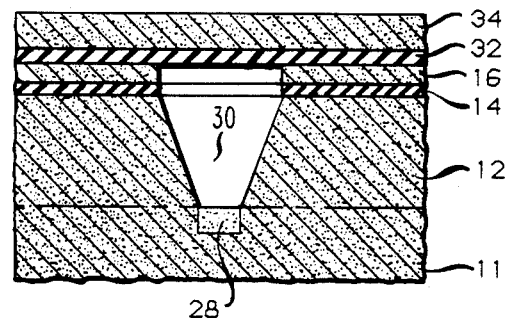

The next step in the fabrication sequence is to form a patterned mask on the device structure. By means of such a mask, between-cell portions of the P-glass layer 30 in the trenches will be subsequently removed by etching. One such advantageous mask can be made, for example, by depositing a 500-Å-thick layer 32 (FIG. 7) of silicon dioxide on the top planar surface of the structure shown in FIG. 6. Then a layer 34 (FIG. 7) of polysilicon is formed overlying the silicon dioxide layer 32. The thickness of the layer 34 depends on the thickness of P-glass to be etched. For 6-μm-deep trenches filled with P-glass, 1500-to-2500 Å of polysilicon is typically required for the layer 34.

Figure 8:
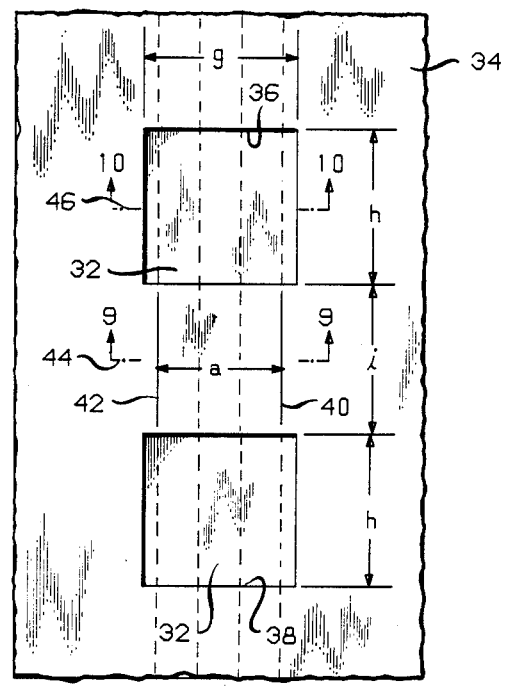

In standard lithographic and RIF etching steps, the polysilicon layer 34 is then patterned. Specifically, between-cell portions of the layer 34 overlying trenches are removed. A top view of the structure showing two such removed or window regions 36 and 38 thus formed in the polysilicon layer 34 is depicted in FIG. 8. Portions of the top surface of the underlying silicon dioxide layer 32 are thereby revealed, as indicated in FIG. 8. Also, dash lines 40 and 42 in FIG. 8 represent the top edges of an underlying trench previously formed in the illustrative device structure.

To allow for alignment tolerances that exist in practice, the window regions 36 and 38 shown in FIG. 8 are designed to have a width that is slightly greater than the width a of the underlying trench. In that way, even windows that are slightly misaligned with respect to the underlying trench will span the entire maximum width of the trench. In one specific illustrative structure in which the trench width a is 1.5 μm, the width g of each of the window regions 36 and 38 is approximately 2 μm. Further, the height h of each of the regions 36 and 38 is about 1 μm. Additionally, the window-to-window distance i is approximately 3.5 μm. In the manner specified later below, two electrically isolated memory-cell capacitors will be respectively formed on the facing trench walls in the space between adjacent window regions. In turn, two MOS transistors will be fabricated respectively overlying portions of each facing pair of trench capacitors. These transistors will extend laterally from each space between adjacent window regions.

By utilizing the patterned polysilicon layer 34 (FIG. 8) as a mask, the exposed portions of the silicon dioxide layer 32 and the directly underlying P-glass portions in the trenches are then etched. This is done, for example, in a standard RIE step that exhibits good selectivity between silicon dioxide and silicon.

Figure 9:
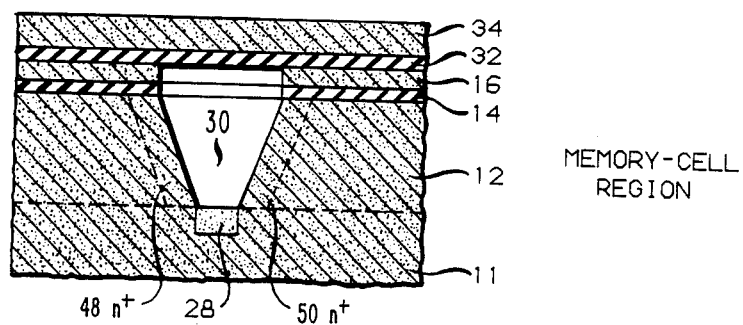

FIG. 9 is a cross-sectional view at dot-dash line 44 of FIG. 4 in the direction of arrows 9. A capacitor will subsequently be built in this portion of the trench. Also, adjacent transistors will be fabricated to respectively extend over the facing edges of the depicted trench. Hence, FIG. 9, which at this point in the fabrication sequence includes P-glass portion 30, represents a memory-cell region.

Figure 10:
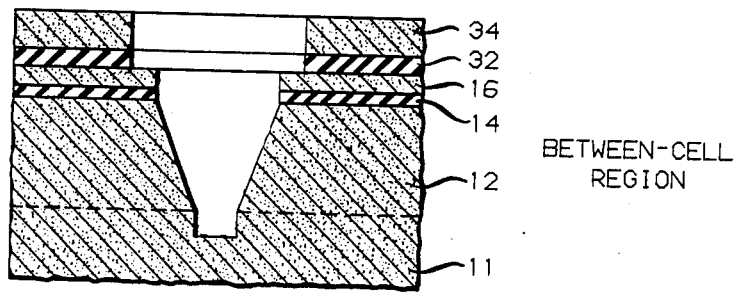

FIG. 10 is a cross-sectional representation at dot-dash line 46 of FIG. 8 in the direction of arrows 10. FIG. 10 shows a between-cell portion of the depicted trench. This portion does not include any P-glass material.

Thus, each trench in the herein-considered device structure includes spaced-apart P-glass portions, such as the portion 30 shown in FIG. 9, only in memory-cell regions of the structure. Accordingly, during a dopant drive-in step, phosphorus is diffused from the noted P-glass portions only into corresponding spaced-apart regions 48 and 50 along the facing walls of each trench, as shown in FIG. 9. Additionally, the presence of the silicon dioxide region 28 at the bottom of the trench insures that no n-type dopant is introduced into the structure to form a conductive bridge between the indicated n+ regions 48 and 50. Thus, spaced-apart capacitors formed on the left-hand trench wall of FIG. 9 are electrically isolated from correspondingly positioned capacitors formed on the right-hand trench wall.

The aforementioned phosphorus drive-in step is carried out, for example, at about 950 degrees Celsius for approximately 30 minutes. It is generally advantageous to do this in a lightly oxidizing atmosphere thereby to minimize the likelihood that phosphorus will cross-diffuse into the between-cell portions of the structure.

The point in the fabrication sequence represented by FIGS. 9 and 10 is particularly convenient for selectively enhancing the level of p-type doping in the between-cell trench portions of the layer 12. Since the cell portions are masked and the between-cell portions are unmasked at that point, implanting a dopant such as boron into the structure causes the doping level in only the between-cell portions to be augmented with p-type impurities. Such an implant step may be supplementary to or a substitute for the boron doping step described earlier above.

Figure 11:
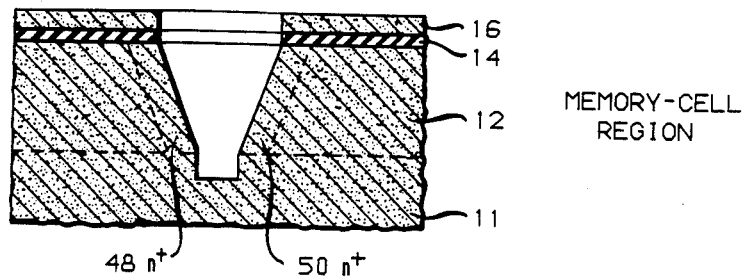
Figure 12:
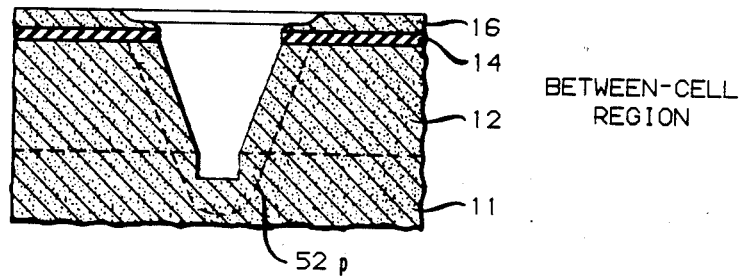

The next step in the fabrication sequence is to remove the upper poly layer 34 shown in FIGS. 9 and 10. The straightforward way of doing this is initially to convert the entire poly layer 34 and exposed surface portions of the thicker poly layer 16 to silicon dioxide. Exposed trench wall surfaces are also thereby converted to silicon dioxide. Then, all the converted oxide, the oxide layer 32, the P-glass portion 30 and the oxide portion 28 are removed in a conventional oxide etching step. At that point, the memory-cell regions appear as shown in FIG. 11, and the between-cell regions appear as shown in FIG. 12.

If the aforementioned boron-implant step was carried out while the memory-cell regions were masked (as indicated in FIG. 9), only the between-cell regions would be augmented with p-type dopant. For illustrative purposes, an augmented p-type region 52 resulting from such a step is shown in FIG. 12.

Next, a relatively thin (for example 150-Å-thick) layer of silicon dioxide is thermally grown overlying the entire top surface and on the trench walls of the herein-considered device structure. (Composite dielectric layers made, for example, of silicon dioxide and silicon nitride could also be formed.) This dielectric layer will constitute the dielectric of the capacitors to be formed on the trench walls of the structure. Such a layer 54 is indicated both in FIG. 13 which shows a memory-cell region of the structure and in FIG. 14 which shows a between-cell region thereof. Subsequently, a doped-polysilicon layer 56 is deposited on top of the oxide layer 54, as shown in each of FIGS. 13 and 14. Illustratively, the thickness j of the layer 56 is approximately 2.5 μm.

Figure 13:
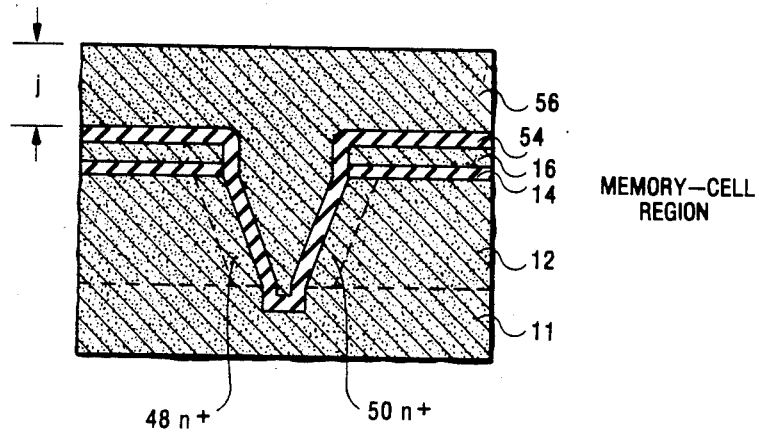
Figure 14:
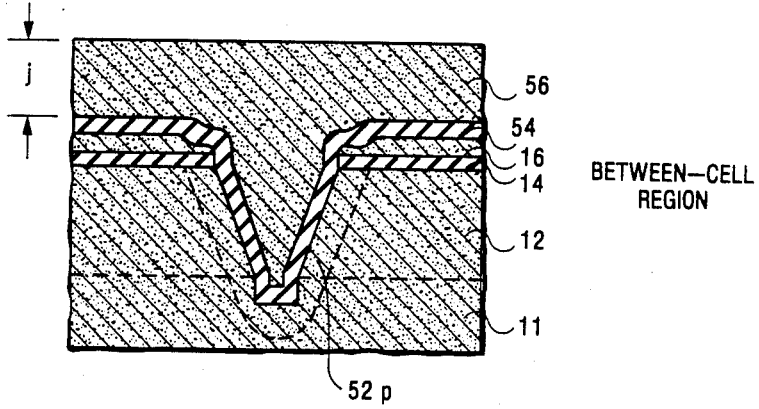
Figure 15:
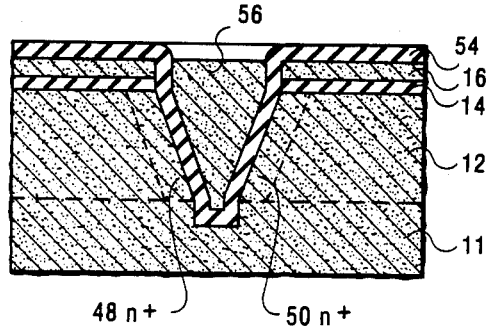
Figure 16:
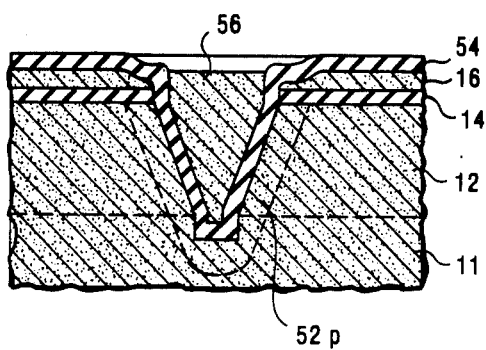
Figure 17:
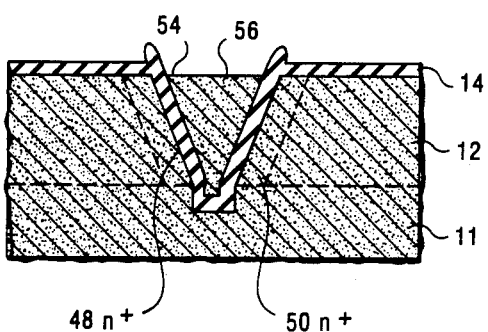
Figure 18:
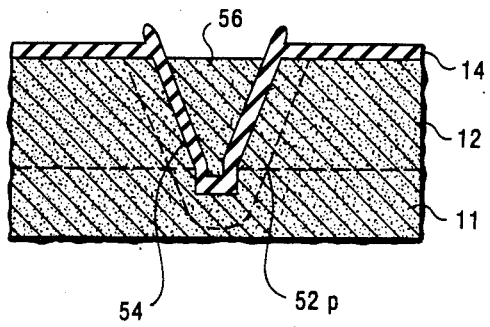

In a subsequent processing step, the poly layer 56 shown in FIGS. 13 and 14 is uniformly etched by conventional techniques to the level depicted in each of FIGS. 15 and 16. Next, the exposed portions of the oxide layer 54 and then the poly layer 16 are removed in standard consecutive RIE steps. At that point, the device structure appears as shown in FIGS. 17 and 18.

The exposed portions of the oxide layer 14 are then removed in, for example, a conventional wet etching step. A layer 58 of silicon dioxide approximately 0.4 μm thick (a so-called field-oxide layer) is then grown overlying the entire top surface of the depicted device structure, as shown in FIGS. 19 and 20.

Figure 22:
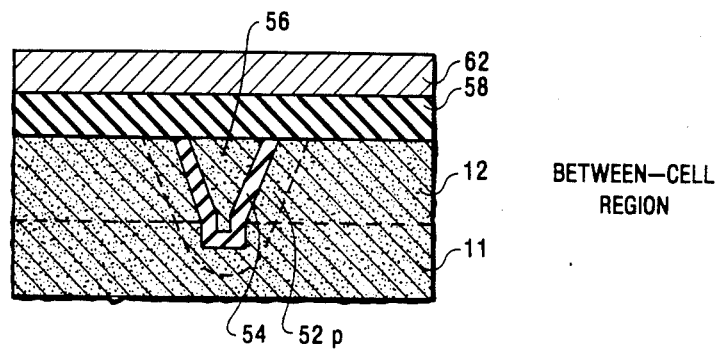

Subsequently, the field-oxide layer 58 is patterned in a standard way to expose surface portions of the device structure in memory-cell regions thereof. The layer 58 is retained in between-cell regions. A silicon dioxide layer 60 about 250 Å thick (a so-called gate-oxide layer) is then grown over the exposed surface of the structure. Next, a doped poly layer 62 approximately 4000 Å thick (a so-called gate-poly layer) is deposited on the entire top surface of the structure. The resulting structure is represented in FIGS. 21 and 22.

Figure 23:
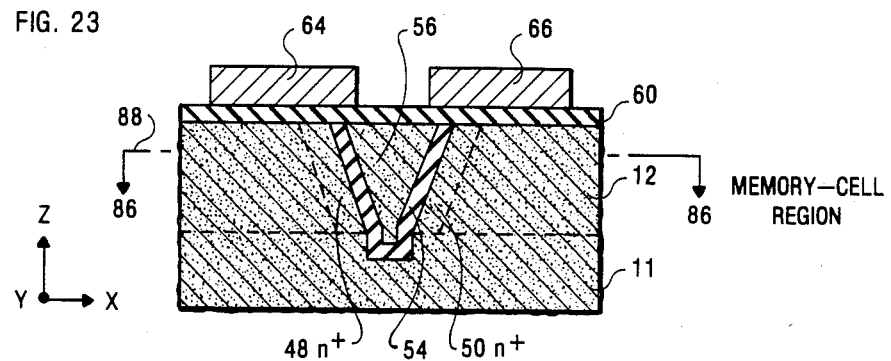
Figure 24:
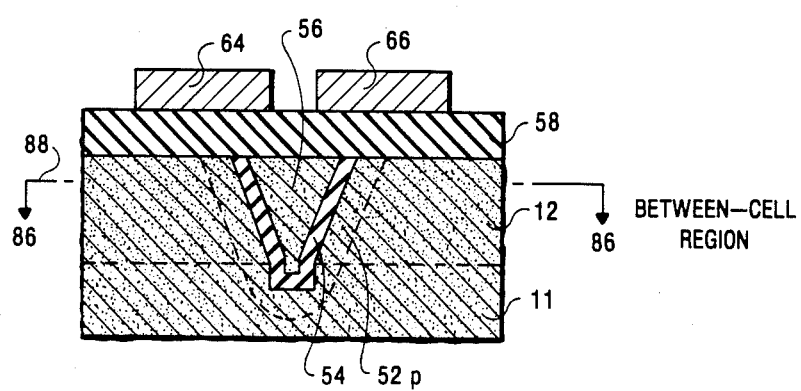

The gate-poly layer 62 (which may also include an overlying silicide layer) is then patterned by conventional techniques, as indicated in FIGS. 23 and 24. The portions 64 and 66 of the patterned layer 62 constitute elongated Y-direction word lines of the herein-described memory array. These portions 64 and 66 also comprise respective gate electrodes for two series of spaced-apart MOS transistors respectively connected to associated capacitors formed on the facing walls of the depicted trench. The n+ regions 48 and 50 (FIG. 23) serve effectively as source/drain regions of two such MOS transistors.

Figure 25:
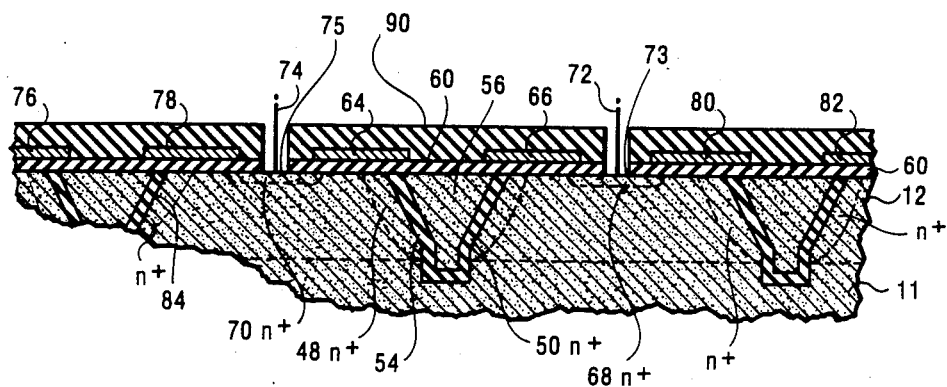

FIG. 25 shows the memory-cell region depicted in FIG. 23 and additionally shows adjacent lateral portions of the herein-described integrated-circuit device structure. These additional portions, which are fabricated in conventional ways well known in the art, include n+ source/drain regions 68 and 70. Further, contacts are made to the regions 68 and 70 after standard deposition of an intermediate dielectric layer 90 and patterning of windows or openings 73 and 75. In FIG. 25, these contacts are represented in a simplified schematic way by leads 72 and 74 which are shown as being electrically connected to the regions 68 and 70, respectively, through openings 73 and 75 in the dielectric layer 90. These leads actually comprise conductive X-direction runners that are spaced-apart and insulated from the Y-direction word lines of the depicted memory array. These X-direction runners constitute bit lines of the array.

The two Y-direction word lines 64 and 66 (FIG. 25) constitute the gate electrodes of multiple MOS transistors. Two of these memory cell transistors are explicitly shown in FIG. 25. One transistor comprises the n+ source/drain region 70, the gate electrode 64 and the n+ source/drain region 48. The other transistor comprises the n+ source/drain region 50, the gate electrode 66 and the n+ source/drain region 68. As indicated, the gate electrode 64 overlaps the region 48, and the gate electrode 66 overlaps the region 50. The 1.5-μm width of the gate electrodes allows for misalignment to the trenches and guarantees a minimum device channel length that will not exhibit an undesirable punch-through of the drain to the source.

Each memory cell in the herein-considered array includes a cell capacitor. Each such cell capacitor comprises in effect two constituent capacitors connected in parallel. Thus, for example, one of the constituent capacitors connected to the source/drain region 48 of the left-hand one of the aforespecified transistors shown in FIG. 25 comprises the n+ region 48, the dielectric layer 54 and the doped poly layer 56 which in one specific illustrative embodiment is electrically connected to the p+-type region 11. The other constituent capacitor connected to the n+ region 48 comprises the effective capacitance of the n+-p junction formed by the n+ layer 48 and the p-type layer 12 which is also electrically connected to the region 11. In turn, the region 11 is, for example, connected to a point of reference potential such as ground.

Similarly, the source/drain region 50 of the right-hand one of the aforespecified transistors shown in FIG. 25 is also connected in effect to two constituent capacitors in parallel. Importantly, the capacitors connected to the left- and right-hand transistors respectively associated with the left- and right-hand facing walls of the centrally located trench shown in FIG. 25 are effectively electrically isolated from each other by the heavily doped region 11. Facing cell structures, for example on either side of the window contact 73, do not interact because of their large separation.

In the specific illustrative embodiment depicted in FIG. 25, two additional trenches are shown. These left- and right-hand trenches are identical to the aforedescribed centrally located one. Two gate electrodes or Y-direction word lines 76 and 78 respectively overhang opposite edges of the left-hand trench. Further, gate electrodes or Y-direction word lines 80 and 82 respectively overhang opposite edges of the right-hand trench. In turn, each of the gate electrodes 76, 78, 80 and 82 comprises an element of a respective MOS transistor. Thus, for example, the transistor associated with the right-hand wall of the left-hand transistor comprises n+ region 84, the gate electrode 78 and the n+ region 70. Note that the region 70 as well as the X-direction bit line 74 are shared between the transistor that includes the gate electrode 78 and the previously described transistor that includes the gate electrode 64.

Figure 26:
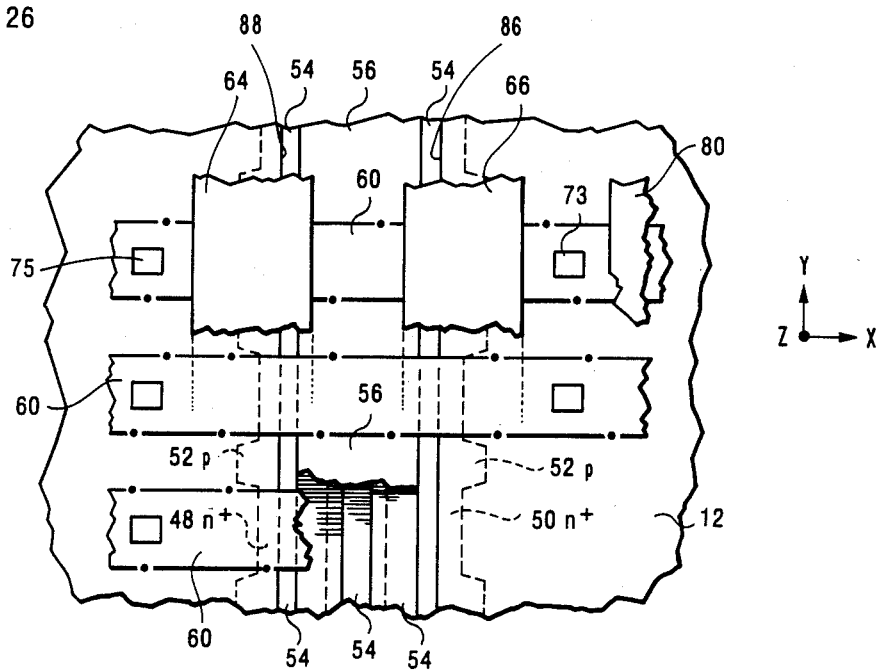

FIG. 26 is a sectional top view in the direction of arrows 86 at X-Y plane 88 of FIGS. 23 and 24. A portion of one elongated trench including poly layer 56 and dielectric layer 54 is shown in FIG. 26. Lines 86 and 88 in FIG. 26 represent the two initially formed facing walls of the trench. As indicated in FIG. 26, multiple spaced-apart memory-cell capacitors are formed along each such wall.

FIG. 26 represents five identical spaced-apart memory-cell regions of a portion of an array made in accordance with the principles of this invention. The region of FIG. 26 that corresponds to the particular region shown in FIG. 23 is designated by dot-dash lines that represent overlying gate-oxide layer 60. The n+ regions 48 and 50 of FIG. 23 are also shown in FIG. 26. Additionally, the overlying elongated word lines or gate electrodes 64 and 66 of FIG. 23 are indicated in FIG. 26 by dash lines. Further, the openings 73 and 75 depicted in FIG. 25 are also represented in FIG. 26. As described earlier, X-direction bit lines (not shown in FIG. 26) extend through these openings to contact the respective underlying source/drain regions 68 and 70 of FIG. 25.

FIG. 26 also represents four identical between-cell regions of a portion of a memory array made in accordance with the principles of this invention. The region of FIG. 26 corresponding to the particular region depicted in FIG. 24 is shown as including p-type region 52.

In subsequent standard steps, the device structure represented in FIGS. 25 and 26 is further processed in straightforward and well-known ways to form a complete packaged memory array. Such an array made in accordance with the principles of the present invention is characterized by very high cell density and advantageous electrical characteristics. These characteristics stem mainly from the herein-specified unique trench capacitor structure. This elongated trench structure with smooth continuous walls exhibits very high capacitance, very high capacitor density, good electrical isolation between capacitors on facing walls and substantial avoidance of any potentially troublesome corners or edges in the array of capacitors.

Finally, it is to be understood that the above-described structures and processing techniques are only illustrative of the principles of the present invention. In accordance with these principles, numerous modifications and alternatives may be devised by those skilled in the art without departing from the spirit and scope of the invention.

What is claimed is:

1. A method of fabricating a memory array, comprising the steps of forming plural parallel spaced-apart elongated trenches having flat continuous facing walls in a semiconductor body which is of one conductivity type, forming a dielectric layer only at the bottom of each trench, filling the entire extent of each trench with a material that constitutes a source of dopant of the opposite conductivity type, removing said material from spaced-apart between-cell regions of each trench, driving dopant from said remaining material into underlying memory-cell regions of each trench, said doped regions including portions that extend to the surface of said body, removing said remaining material from said trenches, forming a dielectric layer on the walls of each trench, filling each trench with a conductive material, and forming a switching device in and overlying said body adapted to be connected to the doped surface portion of each memory-cell region.

* * * * *